United States Patent [19]

le Pierres

[11] Patent Number: 4,575,105

[45] Date of Patent: Mar. 11, 1986

[54] SEAL FOR ELECTRONIC SHELF OF AN AIRPLANE

[75] Inventor: Gildas le Pierres, La Ferte Alais, France

[73] Assignee: Vibrachoc S.A., Saint Cloud, France

[21] Appl. No.: 582,726

[22] Filed: Feb. 23, 1984

[30] Foreign Application Priority Data

Feb. 23, 1983 [FR] France ................................ 83 02908

[51] Int. Cl.⁴ ................................................ F16J 15/10

[52] U.S. Cl. ................................ 277/166; 277/212 F

[58] Field of Search ............... 277/183, 184, 189, 166, 277/212 F

[56] References Cited

U.S. PATENT DOCUMENTS

| | | | |
|---|---|---|---|
| 2,437,900 | 3/1948 | Winkelsohn | 277/166 |
| 2,705,655 | 4/1955 | Brown et al. | 277/166 |
| 4,482,161 | 11/1984 | Izzi | 277/212 F |

*Primary Examiner*—Robert I. Smith

*Attorney, Agent, or Firm*—Brisebois & Kruger

[57] ABSTRACT

An annular seal is positioned in an opening of a shelf for supporting electronic equipment. The annular seal has an outer portion which is clamped between an air flow control plate and the shelf to seal the plate to the shelf, and has an inner seal portion of greater height than the outer portion which extends through the opening in the shelf. The inner seal portion extends above the shelf and is sufficiently resilient to seal against the underside of electronic equipment which can be slid into position the shelf.

12 Claims, 3 Drawing Figures

1
2
3
4
5
6
6'
7
8
9
10
11
12
13
14
15

SEAL FOR ELECTRONIC SHELF OF AN AIRPLANE

The present invention relates to a seal and joint arrangement for an airplane electronic shelf or plate.

BACKGROUND OF THE INVENTION

As is known, an airplane electronic plate is a plate or shelf placed generally horizontally on a rack in an airplane and which supports electronic apparatus or equipment. For this purpose, the plate usually has slides or grooves to permit installing the electronic apparatus or equipment unit, by sliding along the plate during installation. Since the electronic components inside the apparatus or equipment must be cooled, the plate has an opening for the passage of cooling air which passes over the electric apparatus through openings made in the top and bottom of the cabinet for such apparatus.

For the plate to function properly, it is essential to seal between the bottom of the unit placed on the plate and the plate itself, around the air passage and the cooling air opening, and for this purpose there is provided a continuous or annular seal, supported by the plate and designed to be deformed when the apparatus is put in place and to press itself against the lower surface of the apparatus to seal. Of course this seal must be replaceable.

In addition, the flow of air coming from the cooling system must be regulated and for this purpose a diaphragm or air flow control plate is used, that is, a flow plate having one or more fixed surface openings, the flow plate being placed in the opening of the shelf.

There again, it it necessary not only to provide for interchangeability of this flow plate, but also to seal between the flow plate and the shelf at the connection between the shelf and the flow plate. It is already known to use a single seal element to ensure both the seal against the lower surface of the unit of the apparatus and, on the other hand, the seal between the flow plate and the airplane electronic plate or shelf.

The existing solutions include fastening the seal in the periphery of the opening of the plate by suitable fastening means or a groove made in the seal and into which the edge of the opening of the plate extends, and to fasten the diaphragm or air flow plate by inserting its edge into a groove in the body of the seal located below the seal surface that presses against the lower surface of the unit.

These solutions require the forming of complex seals and a high respect for tolerances, especially at the grooves. Moreover, accidental disengagement of the diaphragm or air flow plate cannot be excluded.

SUMMARY OF THE INVENTION

The present invention proposes to remedy these disadvantages and to provide a seal arrangement for an airplane electronic plate or shelf which is simple to make and to mount and which eliminates any risk of disengagement of the seal or the diaphragm.

The invention has as its object a seal for an airplane electronic plate, which is continuous in shape, designed to be placed at the periphery of an opening of an airplane electronic plate so that, on the one hand, a seal is ensured between the plate and the lower surface of apparatus or equipment, and on the other hand, a seal is ensured between the plate and a diaphragm or air flow plate placed in the opening of the shelf plate, characterized in that the seal has, in section, a first portion which is gripped between the lower surface of the bottom of the shelf plate and the upper surface of the diaphragm, a central connecting portion within the opening, and a seal portion at its most inward side, and projecting above the shelf plate so as to be able to seal against the bottom of apparatus on the shelf, and in which the diaphragm is fixed directly against the plate by suitable fastening means.

In one preferred embodiment, the portion which is gripped has a height greater than the connecting portion which joins it to the seal portion so as to allow positive retention in the plane of the plate and to prevent displacement of the seal. Thus, the connecting portion can, for example, form an upwardly opening recess or groove into which the rim of the opening of the plate can extend.

Preferably, in this embodiment, the recess or groove is clearly larger than the thickness of the rim so the seal portion is spaced from the rim.

The width of the groove can advantageously be such that the seal portion has space to move when deformed during sliding positioning of the electronic apparatus or equipment unit on the shelf plate.

Preferably, the seal portion has two annular lips with a groove between them which serves as a lubricating product reservoir.

When the seal of the invention is of large width, there can advantageously be inserted one or more thin metal bands or strips, for example, in the lower surface to prevent lifting of seal unit during the plugging or unplugging of the electronic apparatus.

Other advantages and characteristics of the invention will become apparent from the following description given as a non-limiting example, with reference to the attached drawings.

DETAILED DESCRIPTION

Figures 1, 2, 3:
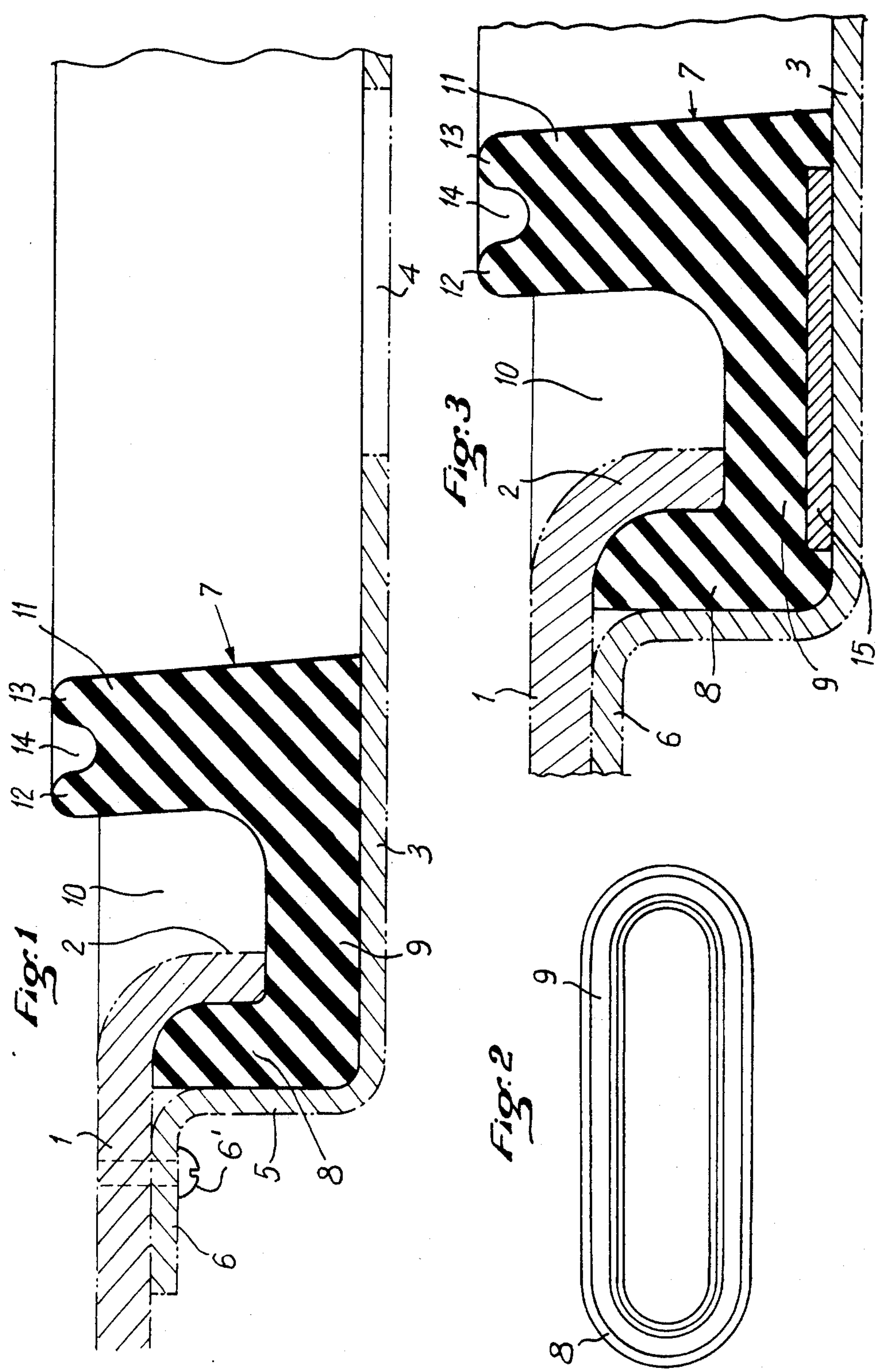
FIG. 1 is a partial view in vertical section of a seal according to the invention, mounted on a support platform or plate.
FIG. 2 is a top plan in view of the seal itself.
FIG. 3 is a partial view in section of another embodiment of the seal.

FIG. 1 shows a support plate, that is to say the upper portion of an airplane electronic shelf or board 1, having an upper surface on which is disposed, the lower or flat plane base of a casing or box of electronic apparatus. Formed in shelf 1 is an oblong opening with a curved edge forming a rim 2 which extends downwardly. A diaphragm or air flow control plate having calibrated air flow passages 4, has an upwardly extending side wall 5 positioned concentrically with and outside the rim 2 of plate 1. Flow control plate 3 has a generally flat horizontal peripheral flange 6. The air flow control plate 3 is adapted to be secured to the underside of shelf 1 in the position shown at FIG. 1, by screws 6'.

The joint seal 7 according to the invention, has a transverse section as shown at FIG. 1, with a first or outer portion 8 adapted to be contained or restrained in the space between the rim 2 and sidwall 5, and vertically between the airflow control plate 3 and the shelf 1. When relaxed, the portion 8 has a height which is greater than the vertical distance between the bottom of shelf 1 and the top of the air flow control plate 3. This causes the portion 8 to be compressed vertically when plate 3 is fastened to shelf 1. The portion 8 takes the form of a shoulder or collar which opposes and resists extraction or removal of the seal inwardly toward the opening in shelf 1. This portion 8 assures a perfect seal between air flow control plate 3 and shelf 1.

An integral connecting portion 9 extrends inwardly from portion 8 of the seal and is of smaller height than the portion 8. This connecting portion 9 forms a groove or recess 10 of a width which is significantly greater than the thickness of rim 2.

The groove 10 is defined by a seal portion 11 which extends upwardly and is of sufficient height when relaxed, to extend above the upper surface of shelf 1. The upper end of the seal portion has two concentric lips 12 and 13 separated by a shallow groove 14 which can contain a lubricant.

It is to be understood that when the apparatus cabinet is in its operating position, to which it is moved by sliding on shelf 1, the bottom of the cabinet rests on the two lips 12 and 13, which assure a good seal against the bottom face of the cabinet.

In addition, it is to be appreciated that when the portion 11 is deformed, for example, under the effect of sliding the cabinet from the right to the left of FIG. 1, the portion 11 can move or deflect into the groove or recess 10 by virtue of the sufficient space provided in the groove.

This arrangement provides a joint seal which is very satisfactory, which seals perfectly, and which is of relatively simple form and easy to manufacture, for example, by molding.

FIG. 3 shows a variation of the invention in which the seal 7 is somewhat larger than the seal of FIG. 1, and has a recess in its bottom face to receive an insert in the form of an oblong ring or band 15. This band 15 is preferably formed from a lightweight metal alloy, and can be inserted when the seal 7 is molded. This ring or band 15 has a width to extend from the portion 8 to beneath the seal portion 11 and serves as a stiffener to prevent separation of the bottom of the portion 11 from the plate 3 so that the portion 11 is constrained to deflect or deform into the region of the groove 10, when the electronic equipment slides across seal 11 during installation of the equipment.

While the cabinet of electronic apparatus or equipment has not been shown, it is to be understood that the cabinet or case of the equipment has a corresponding ventillating opening in its bottom wall and that the seal portion 11 engages the bottom of the cabinet around this opening so that air flowing through the opening in plate 3 cools the electronic apparatus.

Although embodiments of the invention have been described, it is of course understood that numerous changes can be made without departing from the scope or spirit of this invention.

I claim:

1. Seal for an electronic shelf of an airplane, the seal being annular, and placed at the periphery of an opening of an airplane electronic shelf to seal between the shelf and the lower surface of electronic apparatus on the shelf, and to seal between the shelf and an airflow control plate placed in the opening of the shelf, said seal comprising, a resilient continuous annular seal which has, in section, an outer portion gripped between the lower surface of the shelf and the upper surface of the air flow control plate, a central connecting portion inwardly of the outer portion and inside the shelf opening, and a seal portion within the shelf opening and projecting above the shelf, said seal portion having an end face for sealing against the bottom of an electronic unit on the shelf, said seal portion being sufficiently resilient to permit sliding the electronic apparatus over the seal portion, and fastener means for removably fastening the airflow plate directly to the bottom of the shelf.

2. Seal according to claim 1 wherein the height of the connecting portion is less than the height of the portion gripped between the air flow plate and the shelf.

3. Seal according to claim 2 wherein the shelf opening is defined by a down-turned rim, and the gripped portion has the form of a collar which is positively locked against the rim of the shelf opening by the airflow plate.

4. Seal according to claim 3 wherein the projecting portion is spaced inwardly of the rim of the plate and said connecting portion is of a height less than the outer portion, and less than the projecting portion, and forms a groove inwardly of the rim to accommodate the seal portion when it is deformed or displaced by engagement with the electronic apparatus.

5. Seal according to claim 1 characterized in that the seal portion has two lips, and a groove between the lips.

6. Seal according to claim 5 wherein said groove between said lips comprises means for receiving a lubricant.

7. Electronic equipment cooling air shelf and seal arrangement comprising a shelf having an opening for the flow of cooling air, means on said shelf for supporting electronic equipment on the shelf, an airflow control plate having an opening of a size smaller than the shelf opening to regulate the flow of air through the shelf opening, means removable securing the airflow control plate to said shelf, a resilient unitary continuous annular seal having an outer portion clamped between said airflow control plate and the bottom of the shelf and sealing the airflow control plate to the shelf, said seal having an inner portion extending upwardly through the opening in the shelf and including means for sealing against a lower surface of electronic equipment on the shelf.

8. Cooling air shelf according to claim 7 wherein said airflow control plate comprises a flat support surface outwardly of its opening, and said seal has a flat lower surface which seats on said support surface of the airflow control plate.

9. Cooling air shelf according to claim 8 wherein said seal further comprises stiffener means in said seal adjacent said flat lower surface of the seal to prevent lateral distortion and separation of the seal from said support surface of the airflow control plate.

10. Cooling air shelf according to claim 3 wherein said inner portion of said seal is spaced inwardly of said shelf opening to avoid lateral distortion of the seal as a result of axial pressure applied to the seal by engagement of the projecting portion with the lower surface of electronic equipment on the shelf.

11. Cooling air shelf according to claim 7 wherein the opening in the shelf is defined by a downwardly extending rim of the shelf, said air flow control plate includes a rim surrounding and spaced from the rim of the shelf, and said resilient seal is clamped between said rims.

12. Cooling air shelf according to claim 11 wherein said portion of the resilient seal which extends through the shelf opening has a height greater than the portion which is clamped between the rims.

* * * * *